(12) United States Patent
Wang et al.

(10) Patent No.: US 12,288,420 B2
(45) Date of Patent: Apr. 29, 2025

(54) DISPLAY DEVICE, METHOD FOR PRODUCING DISPLAY DEVICE, AND GESTURE RECOGNITION METHOD

(71) Applicant: BOE TECHNOLOGY GROUP CO., LTD., Beijing (CN)

(72) Inventors: Yubo Wang, Beijing (CN); Lei Wang, Beijing (CN); Yangbing Li, Beijing (CN); Liang Cui, Beijing (CN); Yuanyuan Ma, Beijing (CN); Ping Zhang, Beijing (CN); Yanling Han, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 828 days.

(21) Appl. No.: 17/532,670

(22) Filed: Nov. 22, 2021

(65) Prior Publication Data

US 2022/0300733 A1    Sep. 22, 2022

(30) Foreign Application Priority Data

Mar. 19, 2021 (CN) .......................... 202110295374.0

(51) Int. Cl.
*B06B 1/06*    (2006.01)
*B06B 1/02*    (2006.01)
(Continued)

(52) U.S. Cl.
CPC ............ *G06V 40/28* (2022.01); *B06B 1/0215* (2013.01); *B06B 1/0629* (2013.01);
(Continued)

(58) Field of Classification Search
CPC .... B06B 1/0215; B06B 1/0629; B06B 1/0666
(Continued)

(56) References Cited

U.S. PATENT DOCUMENTS

2016/0023245 A1\* 1/2016 Zadesky ............ A61B 5/02444
310/334
2021/0239553 A1\* 8/2021 Akhbari ............... H10N 30/857

OTHER PUBLICATIONS

Ding, Jianlun , "Research on key technology of Signal Processing of Missile phased array radar", University of Electronic Science and Technology of China, China, Master's Thesis, Jul. 2020 (199 pages, including English language translation).

(Continued)

*Primary Examiner* — Derek J Rosenau
(74) *Attorney, Agent, or Firm* — Myers Bigel, P.A.

(57) ABSTRACT

A display device, a method for producing a display device, and a gesture recognition method are disclosed. The display device includes a display module including a base and an array substrate, a resin layer, a first electrode layer, a pixel definition layer, a light-emitting unit layer, a second electrode layer disposed opposite to the first electrode layer, and an encapsulation layer. The light-emitting unit layer is between the first electrode layer and the second electrode layer and includes a plurality of light-emitting units respectively in a plurality of openings of the pixel definition layer, and an ultrasonic sensor including the second electrode layer, a piezoelectric material layer between the first electrode layer and the pixel definition layer, and a third electrode layer between the pixel definition layer and the resin layer. The piezoelectric material layer includes a plurality of piezoelectric material units separated by the plurality of light-emitting units.

17 Claims, 9 Drawing Sheets

(51) Int. Cl.
　　　*G06F 18/214*　　(2023.01)
　　　*G06V 10/40*　　(2022.01)
　　　*G06V 40/13*　　(2022.01)
　　　*G06V 40/20*　　(2022.01)
　　　*G09G 3/3208*　　(2016.01)
　　　*H10K 59/122*　　(2023.01)
　　　*H10K 59/65*　　(2023.01)
　　　*H10K 71/00*　　(2023.01)
　　　*H10K 59/12*　　(2023.01)
　　　*H10N 39/00*　　(2023.01)
(52) U.S. Cl.
　　　CPC .......... *B06B 1/0666* (2013.01); *G06F 18/214* (2023.01); *G06V 10/40* (2022.01); *G06V 40/1306* (2022.01); *G09G 3/3208* (2013.01); *H10K 59/122* (2023.02); *H10K 59/65* (2023.02); *H10K 71/00* (2023.02); *B06B 2201/70* (2013.01); *H10K 59/1201* (2023.02); *H10N 39/00* (2023.02)

(58) Field of Classification Search
　　　USPC .......................................... 310/322, 334, 338
　　　See application file for complete search history.

(56) References Cited

OTHER PUBLICATIONS

Li, Yu , "Research on DOA estimation under Non-uniform Noise", Lanzhou Jiaotong University, China, Master's Thesis, Apr. 2020 (222 pages, including English language translation).

Wang, Xiu , "Research and Application of DOA Estimation Algorithms Based on Ultrasound Sensor Array", Taiyuan University of Technology, Taiyuan, Shanxi, China, Master's Thesis, May 2019 (178 pages, including English language translation).

* cited by examiner

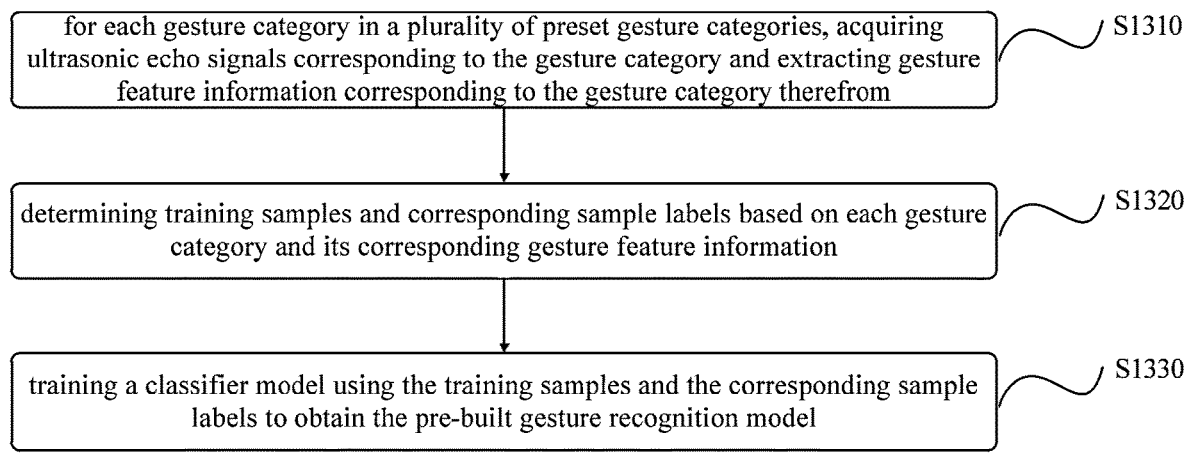

Fig. 13

| Gesture category | Gesture description | |
|---|---|---|
| | Shape | Displacement |
| category 1 | fist | forward |
| category 2 | fist | backward |
| category 3 | fist | upward |
| category 4 | fist | downward |
| category 5 | 1-finger | forward |
| category 6 | 1-finger | backward |
| category 7 | 1-finger | upward |
| category 8 | 1-finger | downward |
| category 9 | 2-finger | forward |
| category 10 | 2-finger | backward |
| category 11 | 2-finger | upward |
| category 12 | 2-finger | downward |
| category 13 | 3-finger | forward |
| category 14 | 3-finger | backward |
| category 15 | 3-finger | upward |
| category 16 | 3-finger | downward |
| category 17 | 4-finger | forward |
| category 18 | 4-finger | backward |
| category 19 | 4-finger | upward |
| category 20 | 4-finger | downward |

Fig. 14

DISPLAY DEVICE, METHOD FOR PRODUCING DISPLAY DEVICE, AND GESTURE RECOGNITION METHOD

RELATED APPLICATION

The present application claims the benefit of Chinese Patent Application No. 202110295374.0, filed on Mar. 19, 2021, the entire disclosure of which is incorporated herein by reference.

TECHNICAL FIELD

The present disclosure relates to the field of display technology, in particular to a display device, a method for producing a display device, and a gesture recognition method.

BACKGROUND

Compared with conventional gesture recognition solutions based on optical imaging, ultrasonic gesture recognition shows certain advantages in optically limited environments such as opaque spaces or environments where light is susceptible to interference and power consumption.

In the ultrasonic gesture recognition solution of the related technology, an ultrasonic sensor is usually directly attached to the back of the display panel, and the ultrasonic sensor is disposed independently of the display panel. Therefore, the ultrasonic waves need to pass through the entire display panel to reach the front of the display panel during the transmission process. As a result, the ultrasonic energy attenuates greatly during the entire transmission process, which affects the accuracy of gesture recognition.

SUMMARY

The present disclosure provides a display device integrated with an ultrasonic sensor and a gesture recognition method using the display device, which can significantly reduce the energy attenuation of ultrasonic waves during transmission, thereby improving the accuracy of gesture recognition.

According to a first aspect of the present disclosure, embodiments of the present disclosure provide a display device comprising: a display module comprising a base and an array substrate, a resin layer, a first electrode layer, a pixel definition layer, a light-emitting unit layer, a second electrode layer disposed opposite to the first electrode layer, and an encapsulation layer sequentially disposed on the base, wherein the light-emitting unit layer is between the first electrode layer and the second electrode layer and comprises a plurality of light-emitting units respectively disposed in a plurality of openings of the pixel definition layer; and an ultrasonic sensor comprising the second electrode layer, a piezoelectric material layer disposed between the first electrode layer and the pixel definition layer, and a third electrode layer disposed between the pixel definition layer and the resin layer, wherein the piezoelectric material layer comprises a plurality of piezoelectric material units separated by the plurality of light-emitting units, and the third electrode layer comprises a plurality of third electrodes respectively disposed corresponding to the plurality of piezoelectric material units.

In some embodiments, the ultrasonic sensor further comprises a plurality of vibration cavities respectively disposed on a side of each of the plurality of third electrodes away from the pixel definition layer.

In some embodiments, each of the plurality of piezoelectric material units is a piezoelectric film.

In some embodiments, an orthographic projection of each of the plurality of piezoelectric material units on the substrate, an orthographic projection of the third electrode corresponding to the piezoelectric material unit on the substrate, and an orthographic projection of the vibration cavity corresponding to the third electrode on the substrate at least partially overlap.

In some embodiments, each of the plurality of vibration cavities is disposed in at least one of the resin layer, the array substrate, and the base.

In some embodiments, a width of each of the plurality of third electrodes is equal to or greater than a width of the corresponding piezoelectric material unit.

In some embodiments, the display device further comprises a control component for controlling the ultrasonic sensor, the control component comprising: an excitation circuit configured to excite the ultrasonic sensor to transmit ultrasonic waves; a receiving circuit configured to receive an echo signal of the ultrasonic waves reflected by a gesture to be recognized and process the echo signal; and a control circuit configured to control the excitation circuit and perform gesture recognition based on the processed echo signal.

In some embodiments, the excitation circuit comprises: an excitation signal generating circuit configured to generate an excitation signal to excite the ultrasonic sensor to transmit ultrasonic waves.

In some embodiments, the excitation circuit further comprises: an impedance matching circuit electrically connected between the excitation circuit and the ultrasonic sensor.

In some embodiments, the receiving circuit comprises: a preamplifier configured to amplify the echo signal of the ultrasonic waves acquired by the ultrasonic sensor; a band-pass filter configured to band-pass filter the amplified echo signal; and an analog-to-digital converter configured to perform analog-to-digital conversion on the filtered echo signal.

In some embodiments, the preamplifier comprises: a differential signal acquisition circuit configured to perform differential signal acquisition on the echo signal of the ultrasonic waves acquired by the ultrasonic sensor, and a differential amplifier circuit configured to amplify the echo signal based on the acquired differential signal.

In some embodiments, the receiving circuit further comprises: a modem configured to demodulate the echo signal after the analog-to-digital conversion.

According to another aspect, there is provided a method for producing a display device, comprising: manufacturing an array substrate layer on a base; depositing a resin layer on the array substrate layer; manufacturing first electrodes and third electrodes interlaced with each other on the resin layer; punching holes on the resin layer to deposit ITO to connect the first electrodes and the third electrodes respectively; etching at positions corresponding to the third electrodes in the resin layer, the array substrate layer and the base to form vibration cavities; depositing a pixel definition layer on the first electrodes and the third electrodes; vapor depositing at positions corresponding to the first electrodes in the pixel definition layer to manufacture a light-emitting layer, and depositing a piezoelectric material layer at positions corresponding to the third electrodes on the pixel definition layer; manufacturing a second electrode layer on the piezoelectric material layer and the light-emitting layer; and manufacturing an encapsulation layer on the second electrode layer.

According to yet another aspect of the present disclosure, there is provided a gesture recognition method using the display device according to claim 1, comprising: transmitting an ultrasonic signal to a gesture to be recognized and receiving an ultrasonic echo signal reflected from the gesture to be recognized by means of an ultrasonic sensor; extracting gesture feature information from the ultrasonic echo signal; and inputting the gesture feature information into a pre-built gesture recognition model to recognize the gesture to be recognized.

In some embodiments, the gesture to be recognized comprises at least one of a shape and an action of a hand to be recognized.

In some embodiments, the gesture feature information comprises at least one of a direction-of-arrival pitch angle, a projection distribution, an echo frequency change, and an echo time of the ultrasonic echo signal.

In some embodiments, the pre-built gesture recognition model is obtained by the following steps: for each gesture category of multiple preset gesture categories, acquiring ultrasonic echo signals of multiple gestures corresponding to the gesture category, and extracting gesture feature information corresponding to the gesture category from the ultrasonic echo signals; determining training samples and corresponding sample labels based on each gesture category of the multiple preset gesture categories and its corresponding gesture feature information; and training a classifier model by means of the training samples and the corresponding sample labels to obtain the pre-built gesture recognition model.

In the display device according to some embodiments of the present disclosure, the ultrasonic sensor is integrated into the display module. Compared with related technologies, the energy attenuation during the transmission of ultrasonic signals can be reduced, and the accuracy of ultrasonic gesture recognition can be improved; compared with the conventional optical recognition method, it avoids the interference of ambient light conditions on gesture recognition; in addition, the display device has both conventional display function and gesture recognition function, which enriches the functions of the display device, optimizes resource allocation (compared with a display device and a gesture recognition device independent of each other) and improves the user experience.

BRIEF DESCRIPTION OF THE DRAWINGS

In order to more clearly illustrate the technical solutions in embodiments of the specification or in the prior art, the appended drawings needed to be used in the embodiments will be introduced briefly in the following. The drawings in the following description are only some embodiments of the specification, and for those of ordinary skills in the art, other drawings may be obtained based on these drawings under the premise of not paying out creative work.

FIG. 13 shows a flowchart of a training method for a gesture recognition model according to some embodiments of the present disclosure; and FIG. 14 shows an example diagram of preset gesture categories of a gesture recognition model according to some embodiments of the present disclosure.

DETAILED DESCRIPTION OF THE DISCLOSURE

The technical solutions in the embodiments of the present disclosure will be clearly and completely described below in conjunction with the drawings in the embodiments of the present disclosure. Obviously, the described embodiments are only a part of the embodiments of the present disclosure, rather than all the embodiments. All other embodiments obtained based on the embodiments of the present disclosure by those of ordinary skill in the art fall within the protection scope of the present disclosure.

It will be understood that although the terms first, second, third, etc. may be used herein to describe various elements, components and/or parts, these elements, components and/or parts should not be limited by these terms. These terms are only used to distinguish one element, component or part from another element, component or part. Therefore, the first element, component or part discussed below may be referred to as the second element, component or part without departing from the teachings of the present disclosure.

The terms used herein are only for the purpose of describing specific embodiments and are not intended to limit the present disclosure. As used herein, the singular forms "a," "an," and "the" are intended to also include the plural forms, unless the context clearly indicates otherwise. It will be further understood that the terms "comprising" and/or "including" when used in this specification designate the existence of the described features, wholes, steps, operations, elements and/or components, but do not exclude the existence of one or more other features, wholes, steps, operations, elements, components, and/or groups thereof or the addition of one or more other features, wholes, steps, operations, elements, components, and/or groups thereof. As used herein, the term "and/or" includes any and all combinations of one or more of the associated listed items.

Unless otherwise defined, all terms (including technical terms and scientific terms) used herein have the same meanings as commonly understood by those of ordinary skill in the art to which this disclosure belongs. It will be further understood that terms such as those defined in commonly used dictionaries should be interpreted as having meanings consistent with their meanings in the relevant field and/or the context of this specification, and will not be idealized or overly interpreted in a formal sense, unless explicitly defined as such herein. It should be noted that the embodiments in the present disclosure and the features in the embodiments can be combined with each other if there is no conflict.

Figure 1:
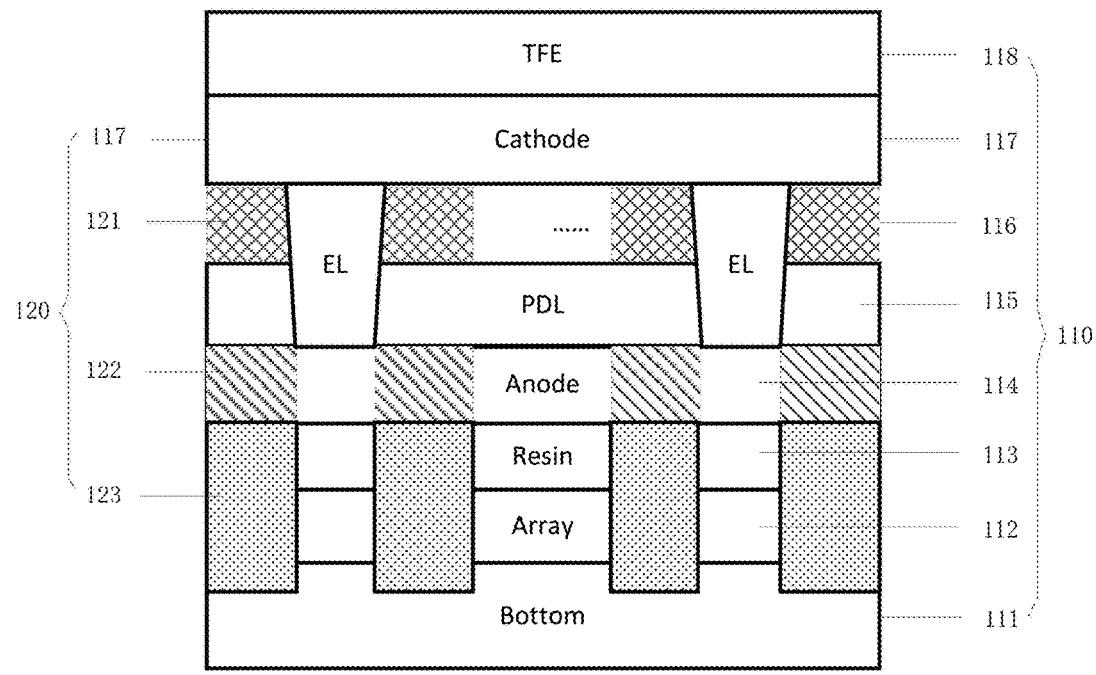
FIG. 1 shows a schematic structural diagram of a display device according to some embodiments of the present disclosure.

FIG. 1 shows a schematic structural diagram of a display device 100 according to some embodiments of the present disclosure. The display device 100 may be an OLED (Organic Light-Emitting Diode) structure. As shown in FIG. 1, the display device 100 includes a display module 110 and an ultrasonic sensor 120 integrated in the display module 110. The ultrasonic sensor 120 is used to realize the gesture recognition function in the display device 100.

As shown in FIG. 1, a display module 110 includes a base 111, and an array substrate 112, a resin layer 113, a first electrode layer 114, a pixel definition layer (PDL) 115, a light-emitting unit layer 116, and a second electrode layer 117 disposed opposite to the first electrode layer 114, and an encapsulation layer 118 sequentially disposed on the base 111, wherein the light-emitting unit layer 116 is between the first electrode layer 114 and the second electrode layer 117 and includes a plurality of light-emitting units respectively disposed in a plurality of openings of the pixel definition layer 115.

As shown in FIG. 1, an ultrasonic sensor 120 may include: the second electrode layer 117, a piezoelectric material layer 121 disposed between the first electrode layer 114 and the pixel definition layer 115, and a third electrode layer 122 disposed between the pixel definition layer 115 and the resin layer 113, wherein the piezoelectric material layer 121 includes a plurality of piezoelectric material units separated by the plurality of light-emitting units, and the third electrode layer 122 includes a plurality of third electrodes respectively disposed corresponding to the plurality of piezoelectric material units. As shown in FIG. 1, each third electrode in the third electrode layer 122 and the first electrode layer 114 can be separated from each other by providing an insulating material. Since the plurality of piezoelectric material units are respectively disposed corresponding to the plurality of third electrodes, the number of third electrodes in the third electrode layer 122 is the same as the number of piezoelectric material units in the piezoelectric material layer 121, and each third electrode corresponds to the corresponding piezoelectric material unit along the layer stacking direction of the display device (i.e., the longitudinal direction in FIG. 1).

In the display device according to some embodiments of the present disclosure, the ultrasonic sensor is integrated into the display module. Compared with related technologies, the energy attenuation during the transmission of ultrasonic signals can be reduced, and the accuracy of ultrasonic gesture recognition can be improved; compared with the conventional optical recognition method, it avoids the interference of ambient light conditions on gesture recognition; in addition, the display device has both conventional display function and gesture recognition function, which enriches the functions of the display device, optimizes resource allocation (compared with a display device and a gesture recognition device independent of each other) and improves the user experience.

In some embodiments, each piezoelectric material unit in the piezoelectric material layer 121 may be a piezoelectric film. The piezoelectric material used for transmitting ultrasonic waves in the piezoelectric material unit may include, but is not limited to, PVDF (PolyVinylidene Fluoride).

As shown in FIG. 1, optionally, the ultrasonic sensor 120 further includes a plurality of vibration cavities 123 respectively disposed on a side of each third electrode in the third electrode layer 122 away from the pixel definition layer 115. The vibration cavities 123 provide a vibration space for the ultrasonic waves transmitted by the piezoelectric material to vibrate toward the base, thereby obtaining a greater vibration amplitude and ensuring a higher sound pressure level. In some embodiments, each vibration cavity 123 of the plurality of vibration cavities 123 is disposed in at least one of the resin layer 113, the array substrate 112, and the base 111. As shown in FIG. 1, for example, the resin layer 113 under the third electrode, the array substrate layer 112 and the base 111 such as the backplane glass may be perforated within a certain thickness, so as to form the vibration cavities 123. As shown in FIG. 1, each vibration cavity 123 may be longitudinally disposed in the resin layer 113, the array substrate 112 and the base 111. Although not shown in FIG. 1, for example, each vibration cavity 123 may be disposed only in the resin layer 113, penetrating the resin layer 113 or not penetrating the resin layer 113; or disposed in the resin layer 113 and the array substrate 112, penetrating the resin layer 113 to the array substrate 112, penetrating or not penetrating the array substrate 112; or penetrating the resin layer 113 and the array substrate 112 to the base 111, but not penetrating the base 111. In other words, the longitudinal depth of the vibration cavities 123 can be adjusted according to actual requirements. The deeper the depth of the vibration cavity 123, the lighter the overall weight of the display device 100, thereby reducing the driving energy required to drive the ultrasonic sensor 120 to vibrate, and improving the electroacoustic conversion efficiency of the ultrasonic sensor 120. Further, the deeper the depth of the vibration cavity 123, the more vibration space can be provided for the ultrasonic wave transmitted by the piezoelectric material unit to vibrate toward the base 111, thereby obtaining a greater vibration amplitude and ensuring a higher sound pressure level.

Figure 2:
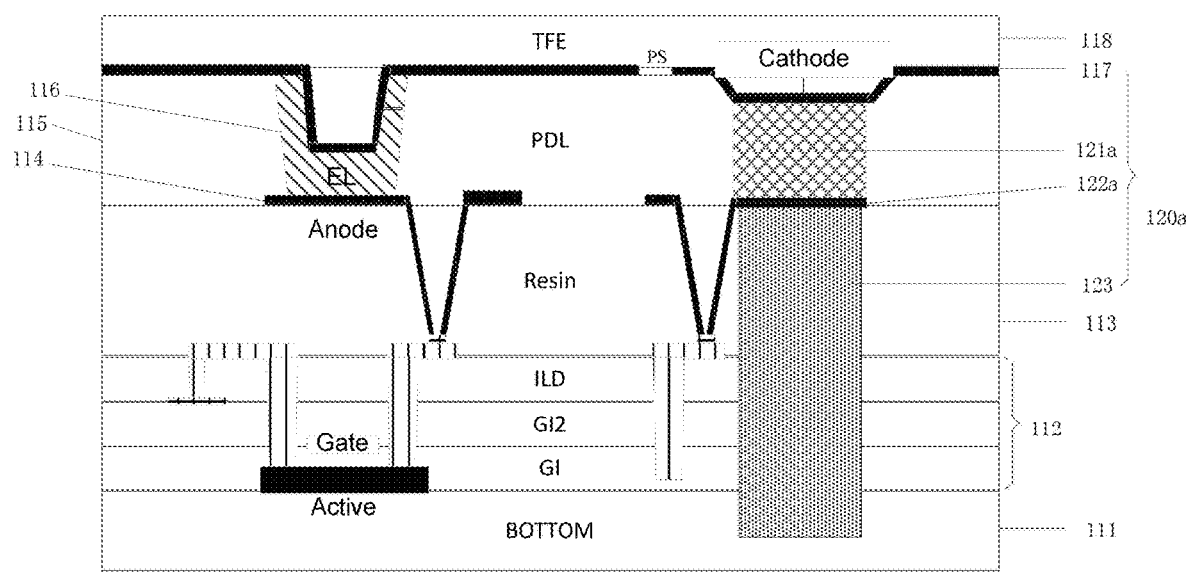
FIG. 2 shows a partial cross-sectional view of a display device according to some embodiments of the present disclosure.

FIG. 2 schematically shows a partial cross-sectional view of a display device 100 according to some embodiments of the present disclosure. Compared with FIG. 1, FIG. 2 shows a partial structure of the display device 100 in more detail. As shown in FIG. 2, the wiring of each layer (for example, the first electrode layer 114, the second electrode layer 117 and the third electrode layer 122) of the display device 100 can be led out to the periphery of the display panel through the array substrate layer 112. As shown in FIG. 2, each piezoelectric material unit 121a that transmits ultrasonic can be fabricated between the second electrode 117 and the corresponding third electrode 122a, thereby forming an ultrasonic sensor unit 120a. Therefore, in the ultrasonic sensor 120, the number of ultrasonic sensor units 120a is the same as the number of piezoelectric material units 121a and the number of third electrodes 122a. Optionally, the ultrasonic sensor unit 120a may further include a vibration cavity 123, which is formed under the third electrode 122a by perforating or hollowing out the resin layer 113, the array substrate layer 112, and the base 111. As shown in FIG. 2, in order to accurately apply the excitation voltage to the piezoelectric material unit 121a, the third electrode (i.e., the lower electrode) 122a, the corresponding vibration cavity 123 (i.e., the perforated area), and the piezoelectric material unit 121a need to be on the same line. In some embodiments, as shown in FIG. 2, the width of the third electrode 122a is equal to or greater than the width of the corresponding piezoelectric material unit; or the diameter of the lower electrode (i.e., the third electrode 122a) may be the same as or slightly larger than that of the piezoelectric material unit 121a. However, the size of the lower electrode cannot be too large to avoid electrical interference between the two sensor units 120a.

Figure 3:
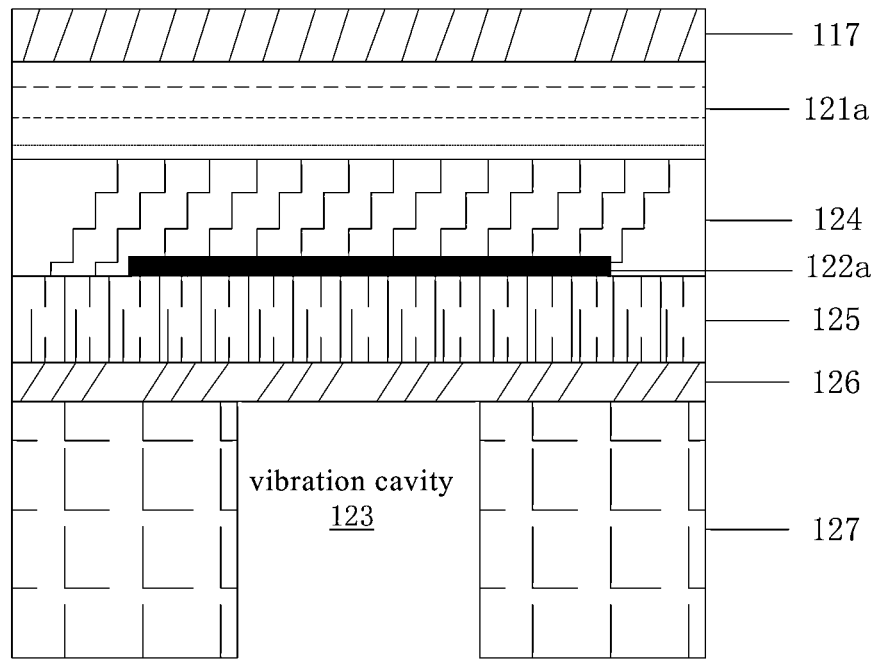
FIG. 3 shows a schematic structural diagram of an ultrasonic sensor unit according to some embodiments of the present disclosure.

FIG. 3 schematically shows a structural diagram of an ultrasonic sensor unit according to some embodiments of the present disclosure. As shown in FIG. 3, the ultrasonic sensor unit 120a includes a second electrode 117 as an upper electrode, a third electrode 122a as a lower electrode, and a piezoelectric material unit 121a interposed between the second electrode 117 and the third electrode 122a. Optionally, as shown in FIG. 3, the ultrasonic sensor unit 120a may further include an insulating layer 124 between the third electrode and the first electrode, and a support layer 125 that supports the third electrode 122a between the vibration cavity 123 and the resin layer 113 and the third electrode 122a, and an adhesive layer 126 that adheres the third electrode 122a on the resin layer 113. As shown in FIG. 3, in the display device 100, the sensor unit 120a is a suspended film structure formed of multiple layers, in which the areas that are not hollowed out (that is, the area other than the vibration cavity 123) in the resin layer 113, the array substrate layer 112, and the base 111 (such as backplane glass) of the display module constitutes the substrate 127 of the sensor unit 120a. In the multi-layer suspended film structure of the sensor unit 120a, the height of each layer and the depth of the corresponding hollowed out area (i.e., the vibration cavity 123) can be adjusted appropriately to adjust the overall quality of the sensor unit 120a.

As shown in FIGS. 1-3, the orthographic projection of each piezoelectric material unit 121a on the base 111, the orthographic projection of the third electrode 122a corresponding to the piezoelectric material unit 121a on the base 111, and the orthographic projection of the vibration cavity 123 corresponding to the third electrode 122a on the base 111 at least partially overlap. In this way, when the display device 100 receives the excitation signal, the excitation signal can be accurately applied to the piezoelectric material unit 121a, which is beneficial to the ultrasonic sensor unit 120a to transmit the ultrasonic signal, so as to make the gesture recognition based on the ultrasonic signal more accurate and reliable.

Figure 4:
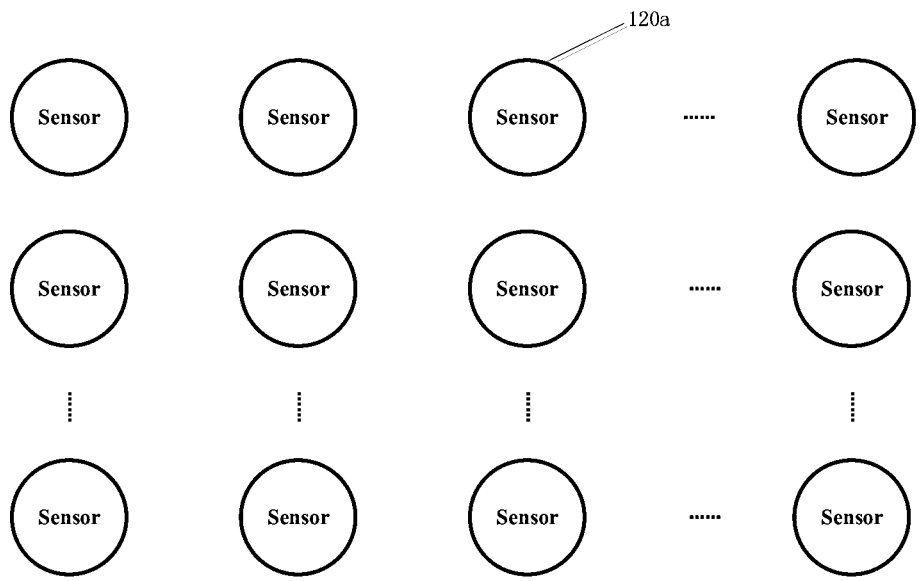
FIG. 4 shows a distribution diagram of ultrasonic sensor units in an ultrasonic sensor according to some embodiments of the present disclosure.

FIG. 4 shows a distribution diagram of ultrasonic sensor units in an ultrasonic sensor according to some embodiments of the present disclosure. As shown in FIG. 4, in some embodiments, the ultrasonic sensor units 120a in the ultrasonic sensor 120 may be disposed in an array, for example, disposed in an M*N array, where M may be equal to N or not equal to N. Both M and N are positive integers. Such a distribution manner of the ultrasonic sensor units 120a can transmit and receive ultrasonic signals and echo signals in all directions and at multiple angles from various different positions, so as to recognize the target gesture more comprehensively and accurately.

Figure 5:
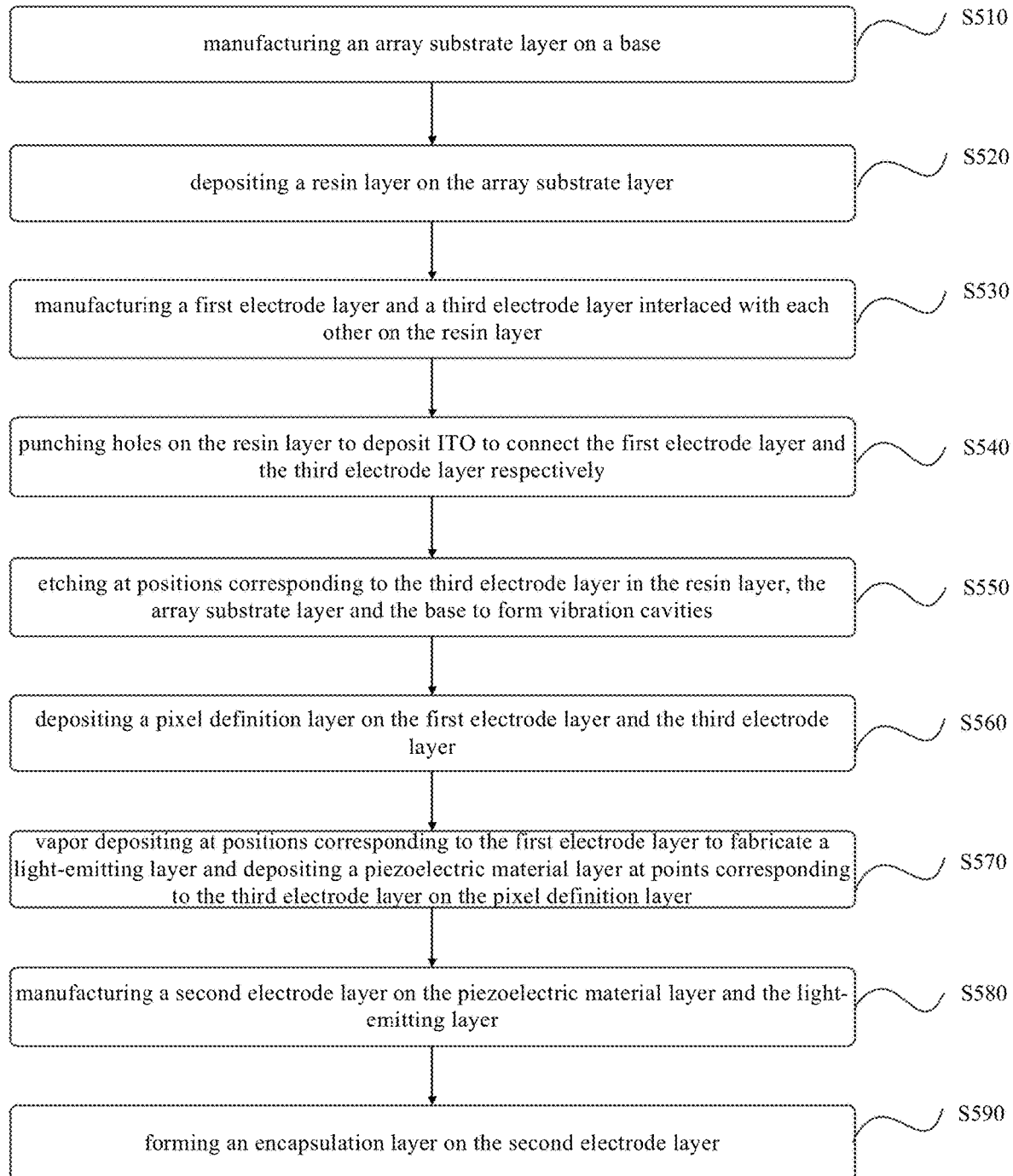
FIG. 5 shows a flowchart of a method for producing a display device according to some embodiments of the present disclosure.

FIG. 5 shows a flowchart of a method for producing a display device according to some embodiments of the present disclosure.

As shown in FIG. 5 and referring to FIG. 2, the display device 100 according to some embodiments of the present disclosure can be fabricated through the following steps:

S510, depositing an array of etched pixel thin film transistors on a base to fabricate an array substrate layer, where the wiring of the array substrate layer can keep away from the area to be perforated (that is, the vibration cavity area), and the base may include a glass substrate;

S520, depositing a resin layer on the array substrate layer;

S530, manufacturing a first electrode layer and a third electrode layer interlaced with each other on the resin layer;

S540, punching holes on the resin layer to deposit ITO to connect the first electrode layer and the third electrode layer respectively;

S550, etching at positions corresponding to the third electrode layer in the resin layer, the array substrate layer and the base to form vibration cavities;

S560, depositing a pixel definition layer on the first electrode layer and the third electrode layer;

S570, vapor depositing at positions corresponding to the first electrode layer in the pixel definition layer to fabricate a light-emitting layer, and depositing a piezoelectric material layer at positions corresponding to the third electrode layer on the pixel definition layer;

S580, manufacturing a second electrode layer on the piezoelectric material layer and the light-emitting layer;

S590, forming an encapsulation layer on the second electrode layer.

In some embodiments, since the resin layer and the array substrate layer need to be etched in the manufacturing method for the display device shown in FIG. 5, etching residues are prone to exist and the etching is not clean. Therefore, the masking method can be used to fabricate the perforated area (such as the vibration cavity), that is, in the process of manufacturing each layer (such as the resin layer and the array substrate layer), the area to be perforated can be blocked by making a mask. After the fabrication is completed, the mask is removed to avoid etching residue on the formed perforated area.

Figure 6:
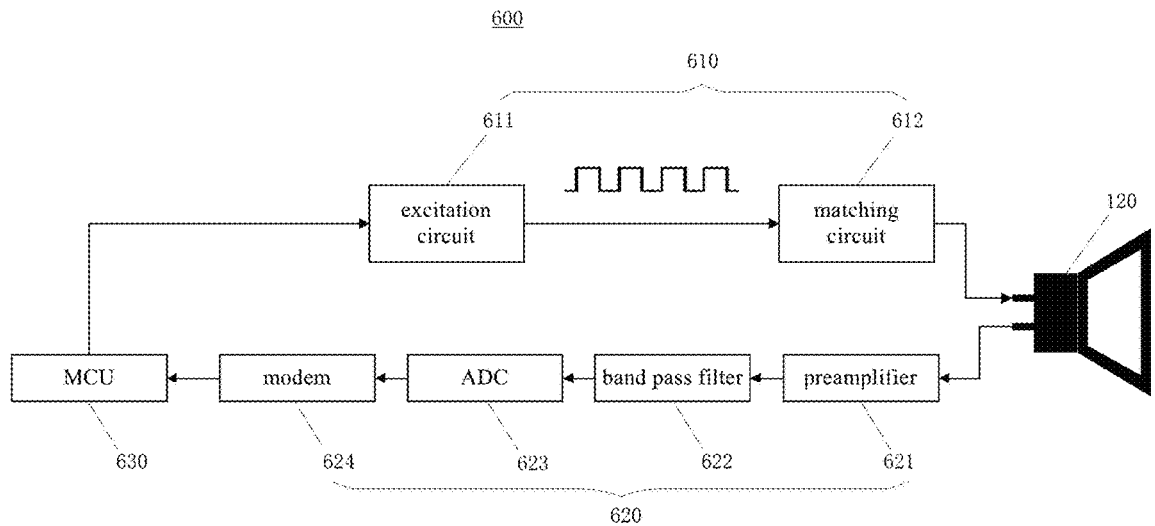
FIG. 6 shows a structural block diagram of a control component in a display device according to some embodiments of the present disclosure.

FIG. 6 shows a structural block diagram of a control component for controlling an ultrasonic sensor in a display device according to some embodiments of the present disclosure. As shown in FIG. 6, the control component 600 for controlling the ultrasonic sensor 120 includes: an excitation circuit 610, a receiving circuit 620 and a control circuit 630. The excitation circuit 610 is configured to excite the ultrasonic sensor 120 to transmit ultrasonic waves. The receiving circuit 620 is configured to receive the echo signal, of the ultrasonic wave, reflected by the gesture to be recognized and process the echo signal. The control circuit 630 is configured to control the excitation circuit 610 and perform gesture recognition based on the processed echo signal.

As shown in FIG. 6, the excitation circuit 610 may include an excitation signal generating circuit 611 configured to generate an excitation signal to excite the ultrasonic sensor to transmit ultrasonic waves. As shown in FIG. 6, the excitation signal generated by the excitation signal generating circuit 611 may be a square wave with a certain pulse period to excite or drive the ultrasonic sensor 120 to transmit ultrasonic waves. Optionally, the excitation circuit 610 may further include an impedance matching circuit 612 electrically connected between the excitation signal generating circuit 611 and the ultrasonic sensor 120. For example, in order to achieve a larger (or even maximum) power output of the ultrasonic sensor 120, a broadband impedance matching circuit 612 can be designed (see FIGS. 7a-7c for details). Based on the broadband impedance matching circuit 612, the ultrasonic sensor 120 can have the maximum active power output in a wider frequency range. This helps to realize the adaptability of the excitation signal generating circuit 611 to different resonant frequencies and improve the active power output efficiency of the ultrasonic sensor 120. The excitation circuit 610 may include an ultrasonic high-voltage driving circuit based on a multi-stage high-speed operational amplifier and LC resonance to provide the high-frequency and high-voltage required to drive the piezoelectric material unit 121a of the ultrasonic sensor 120. For the detailed circuit diagram of the excitation circuit 610, please refer to FIGS. 7a-7b and their corresponding descriptions.

As shown in FIG. 6, the receiving circuit 620 for receiving and processing the echo signal may include: a preamplifier 621, a band pass filter 622, and an ADC (Analog to Digital Converter) 623 connected in sequence. The preamplifier 621 is configured to amplify the echo signal of the ultrasonic wave acquired by the ultrasonic sensor 120. The band pass filter 622 is configured to filter the amplified echo signal. The ADC 623 is configured to perform analog-to-digital conversion on the filtered echo signal. Optionally, as shown in FIG. 6, the receiving circuit 620 may further include a modem 624 configured to demodulate the echo signal after the analog-to-digital conversion to extract the signal required for gesture recognition from the echo signal.

Figure 7A:
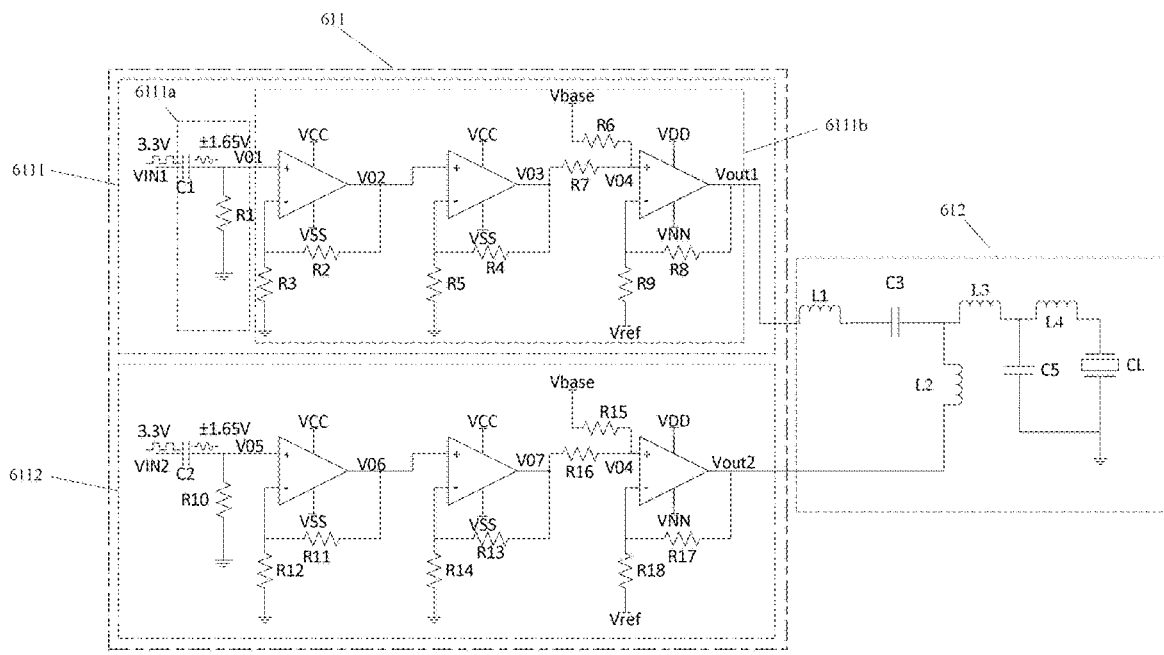
FIG. 7a shows a schematic circuit diagram of the excitation circuit shown in FIG. 6 according to some embodiments of the present disclosure.

FIG. 7a shows a schematic circuit diagram of the excitation circuit 620 shown in FIG. 6 according to some embodiments of the present disclosure. In order to excite the ultrasonic sensor 120 to transmit an ultrasonic signal, the piezoelectric material unit 121a needs to be driven. Piezoelectric materials such as PVDF usually require high-frequency and high-voltage driving, so the excitation circuit 620 can be designed as an ultrasonic high-voltage driving circuit based on multi-stage high-speed operational amplifiers and LC resonance. In the excitation circuit 620, for the circuit input control signal, the input signal voltage is first amplified to a higher voltage through a multi-stage operational amplifier, and then resonated to a still higher voltage through a two-stage LC resonance circuit to drive the piezoelectric material unit (PVDF) in the ultrasonic sensor 120 to make the ultrasonic sensor 120 transmit an ultrasonic signal.

As shown in FIG. 7a, the excitation circuit 610 may include an excitation signal generating circuit 611 and an impedance matching circuit 612 that are electrically connected to each other. The excitation signal generating circuit 611 is configured to generate an excitation signal, and the (broadband) impedance matching circuit 612 is configured to match the impedance of the ultrasonic sensor.

As shown in FIG. 7a, the excitation signal generating circuit 611 includes two operational amplifier circuits 6111, 6112. The structure and working principle of the two operational amplifier circuits 6111, 6112 are the same, so only one of the operational amplifier circuits 6111 is described herein as an example.

As shown in FIG. 7a, the operational amplifier circuit 6111 includes an input terminal, a high-pass filter unit 6111a, a plurality of amplifying units 6111b, and an output terminal connected in sequence.

As shown in FIG. 7a, the high-pass filter unit 6111a includes a first capacitor C1 and a first resistor R1. One terminal of the first capacitor C1 is connected to the input terminal, the other terminal is connected to the amplifying unit 6111b, and one terminal of the first resistor R1 is connected between the first capacitor C1 and the amplifying unit 6111b, the other terminal is grounded.

As shown in FIG. 7a, the plurality of amplifying units 6111b include a primary amplifying unit, an intermediate amplifying unit, and a final amplifying unit. The primary amplifying unit and the intermediate amplifying unit are connected to the first power supply VCC and VSS, and the final amplifying unit is connected to the second power supply VDD and VNN. In some embodiments, as shown in FIG. 7a, there is one intermediate stage amplifying unit; each amplifying unit 6111b includes a first amplifier.

The first terminal (forward input terminal) of the primary first amplifier is connected to the high-pass filter unit 6111a, and the second terminal (reverse input terminal) of the primary first amplifier is connected to the third terminal (output terminal) through the second resistor R2, and is grounded through third resistor R3, the third terminal (output terminal) is connected to the first terminal of the intermediate first amplifier; the second terminal of the intermediate first amplifier is connected to the first terminal of the final first amplifier through a fourth resistor R4, and is grounded through the fifth resistor R5; the first terminal of the final first amplifier is connected to the voltage Vbase through the sixth resistor R6, and is connected to the third terminal of the intermediate first amplifier through the seventh resistor R7, the second terminal of the final first amplifier is connected to the third terminal through the eighth resistor R8, and is connected to the reference voltage Vref through the ninth resistor, the third terminal of the final first amplifier is used as the output terminal of the operational amplifier circuit 6111.

The input terminals of the two operational amplifier circuits 6111 and 6112 are used to input control signals with a certain phase difference, which are respectively amplified by the operational amplifier circuits 6111 and 6112 and output to the impedance matching circuit 612. In the following, specifically, one of the operational amplifier circuits 6111 is taken as an example for description. In the operational amplifier circuit 6111, the input terminal receives the voltage signal VIN1, which is first high-pass filtered by the high-pass filter unit 6111a; then, the voltage signal VIN1 is amplified by the two-stage non-inverting amplification (via the primary and intermediate amplifying units) to obtain the output voltage signal V03; in the third-stage operational amplifying (via the final amplifying unit), a non-inverting summation circuit is formed by the voltage Vbase added at the forward input terminal, and in order to obtained a high voltage for an output signal Vout1, this stage operational amplifier uses asymmetric power supply, which can change the output dynamic range of the operational amplifier to make the forward power supply VDD take a higher value, so that the output voltage Vout1 can be as high as possible. At the same time, at the feedback loop of the second terminal (inverting input terminal), a reference voltage Vref is added at the position of the ninth resistor R9 to achieve a voltage increase.

The impedance matching circuit 612 includes a first-stage matching network, a second-stage matching network, and a third-stage matching network. The first-stage matching network includes a first input circuit and a second input circuit respectively connected to two operational amplifier circuits 6111, 6112. As shown in FIG. 7a, the first input circuit includes a first inductor L1 and a third capacitor C3 connected in series. One terminal of the first inductor L1 is connected to the output terminal of one of the operational amplifier circuits 6111, and the other terminal is connected to the second-stage matching network through the third capacitor C3. The second input circuit includes a second inductor L2. One terminal of the second inductor L2 is connected to the output terminal of another operational amplifier circuit 6112, and the other terminal is connected to the second-stage matching network. The second-stage matching network includes a third inductor L3 and a fifth capacitor C5. One terminal of the third inductor L3 is connected to the third capacitor C3 and the second inductor L2, and the other terminal is connected to the third matching network. One terminal of the fifth capacitor C5 is connected between the third inductor L3 and the third matching network, and the other terminal is grounded. The third matching network includes a fourth inductor L4, one terminal of the fourth inductor L4 is connected to the third inductor L3, and the other terminal is grounded through the CL of the ultrasonic sensor 120.

As shown in FIG. 7a, the input signals VIN1 and VIN2 of the operational amplifier circuits 6111 and 6112 in the excitation signal generating circuit 611 are input control signals with a certain phase difference, which can be connected to the impedance matching circuit 612 after operational amplification in the two operational amplifier circuits. Specifically, as shown in FIG. 7a, the first operational amplifier circuit 6111 is connected to the first input circuit formed by the first inductor L1 and the third capacitor C3, and the second operational amplifier circuit 6112 is connected to the second input circuit formed by the second inductor L2, to achieve the first stage of matching; then through the second-stage matching network formed by the third inductor L3 and capacitor C5, to achieve the second stage of matching; finally connected to the third-stage matching network formed by the fourth inductor L4 and the CL of the ultrasonic sensor 120, to achieve the third stage of matching. The impedance matching circuit 612 can simultaneously realize the two functions of matching the maximum power at the resonant frequency and resonant boosting of the excitation voltage.

Figure 7B:
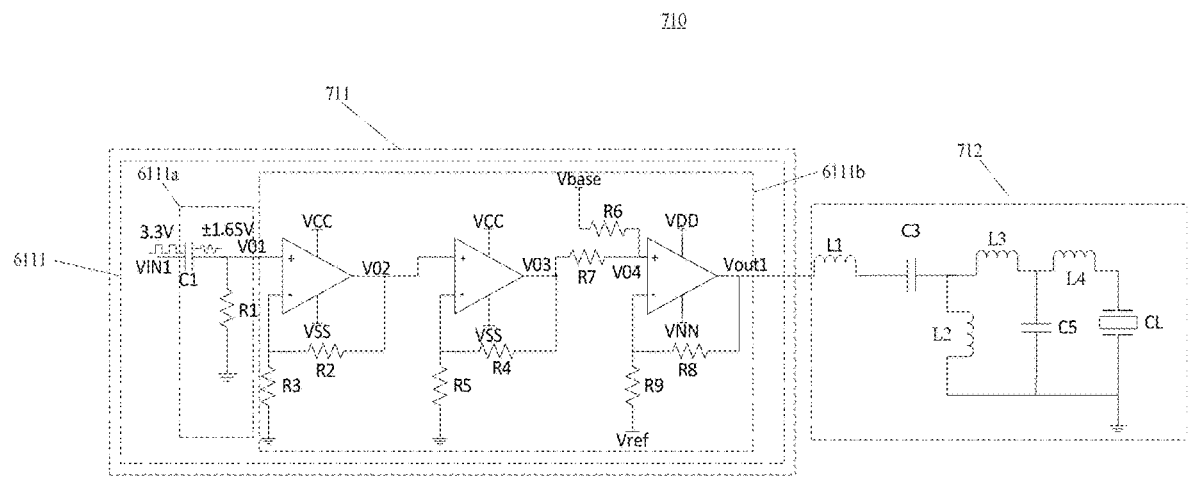
FIG. 7b shows a schematic circuit diagram of the excitation circuit shown in FIG. 6 according to other embodiments of the present disclosure.

FIG. 7b shows a schematic circuit diagram of the excitation circuit shown in FIG. 6 according to other embodiments of the present disclosure. For occasions where the voltage requirements are not high, only one of the two operational amplifier circuits 6111, 61112 of the excitation signal generating circuit 611 in the excitation circuit 610 shown in FIG. 7a can be reserved; in this case, the impedance matching circuit 612 of the excitation circuit 610 may be changed to ground the second inductor L2 correspondingly.

As shown in FIG. 7b, the excitation circuit 710 includes an excitation generating circuit 711 and an impedance matching circuit 712. The excitation generating circuit 711 only includes one operational amplifier circuit 6111 in the excitation circuit 610 shown in FIG. 7a. In the impedance matching circuit 712, except that the second inductor L2 is changed to ground, the other circuit structure is the same as the impedance matching circuit 612 shown in FIG. 7a.

Figure 7C:
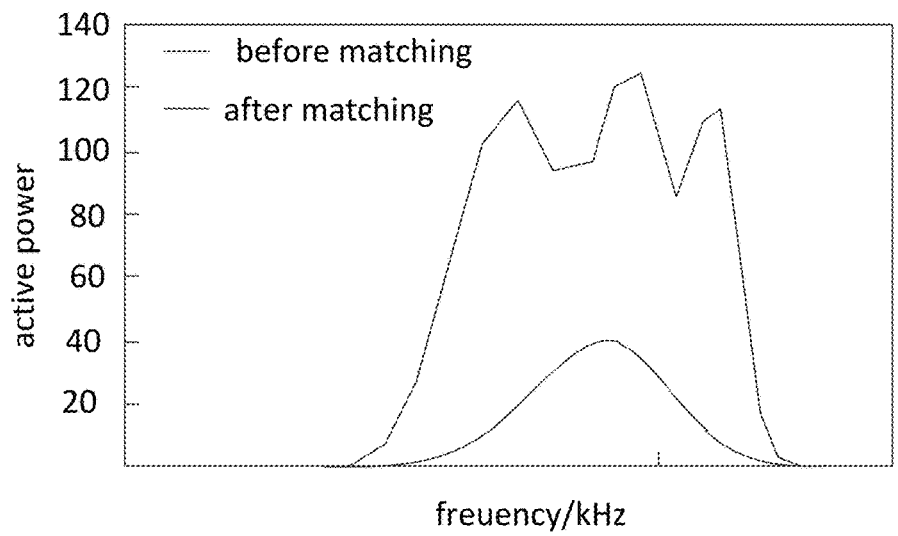
FIG. 7c shows the relationship between active power and frequency of the impedance matching circuit shown in FIG. 6 before and after matching according to some embodiments of the present disclosure.

FIG. 7c shows the relationship between active power and frequency of the impedance matching circuit shown in FIG. 6 before and after matching according to some embodiments of the present disclosure. Broadband impedance matching circuits (such as impedance matching circuits 612 and 712 shown in FIGS. 7a-7b) according to some embodiments of the present disclosure can realize that the ultrasonic sensor 120 has the maximum active power output in a wide frequency range, which helps realizing the adaptability of the excitation generating circuit 611 to different resonance frequencies, and the active power output efficiency of the ultrasonic sensor 120 is improved. As shown in FIG. 7c, by comparing the active power before and after the matching, the impedance matching circuit according to the embodiment of the present disclosure can significantly increase the maximum active power output in a wider frequency range.

Figure 8:
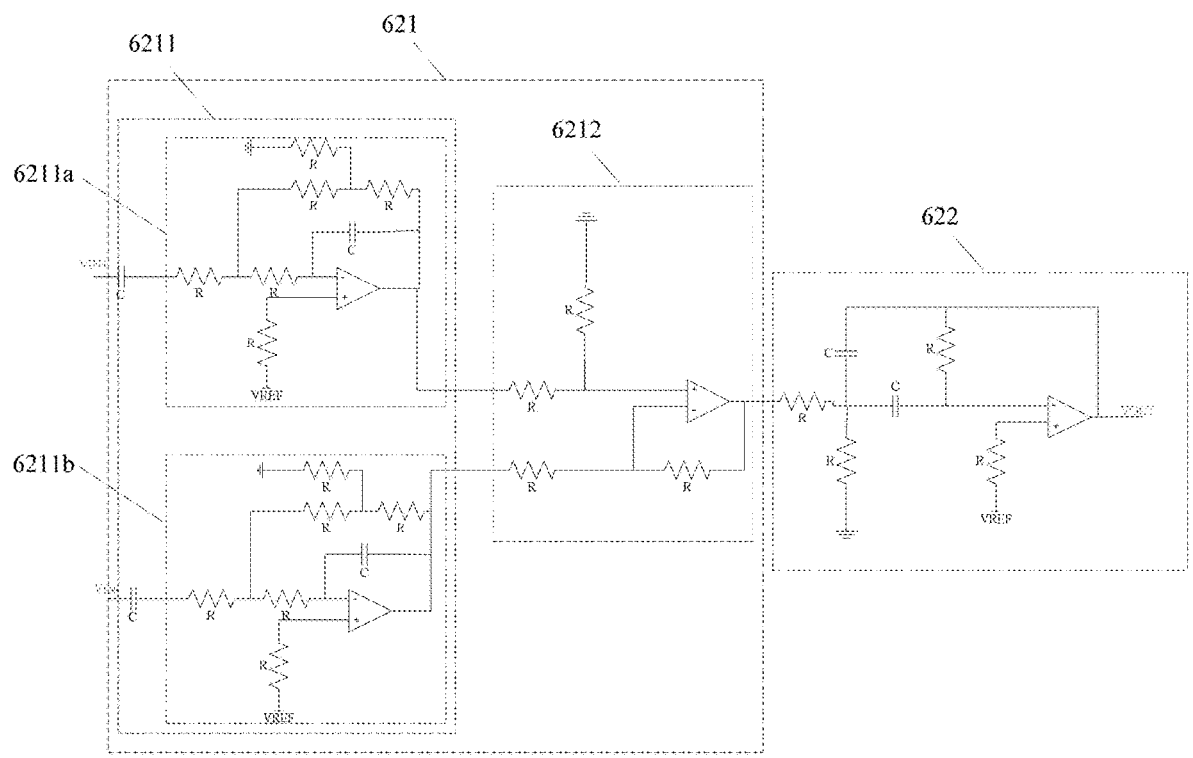
FIG. 8 shows a schematic circuit diagram of a preamplifier and a band-pass filter in the receiving circuit shown in FIG. 6 according to some embodiments of the present disclosure.

FIG. 8 shows a schematic circuit diagram of a preamplifier and a band-pass filter in the receiving circuit shown in FIG. 6 according to some embodiments of the present disclosure.

As shown in FIG. 8, the preamplifier 621 includes a differential signal acquisition circuit 6211 and a differential amplifier circuit 6212 that are connected to each other, wherein the differential signal acquisition circuit 6211 is configured perform differential signal acquisition on the echo signal of the ultrasonic waves from the ultrasonic sensor, and the differential amplifier circuit is configured to amplify the echo signal based on the acquired differential signal. The differential signal acquisition circuit 6211 may be electrically connected to the ultrasonic sensor 120 for acquiring ultrasonic echo signals; the differential amplifier circuit 6212 is used for amplifying the acquired echo signals for subsequent processing. The differential signal acquisition circuit 6211 may be of a voltage type or a charge type.

As shown in FIG. 8, the differential signal acquisition circuit 6211 may include two identical sub-acquisition circuits 6211a and 6211b, which are respectively connected to the positive and negative electrodes of the ultrasonic sensor to realize differential signal acquisition; after acquisition, the differential amplification circuit 6212 performs signal amplification.

As shown in FIG. 8, the band-pass filter 622 is connected to the output terminal of the differential amplifier circuit 621b in the preamplifier 621 for band-pass filtering the amplified echo signal, so as to use subsequent signal to perform recognition. The specific structures and working principles of the band-pass filter 622 and the preamplifier 621 may be similar to those of the related art, and will not be repeated here.

Figure 9A:
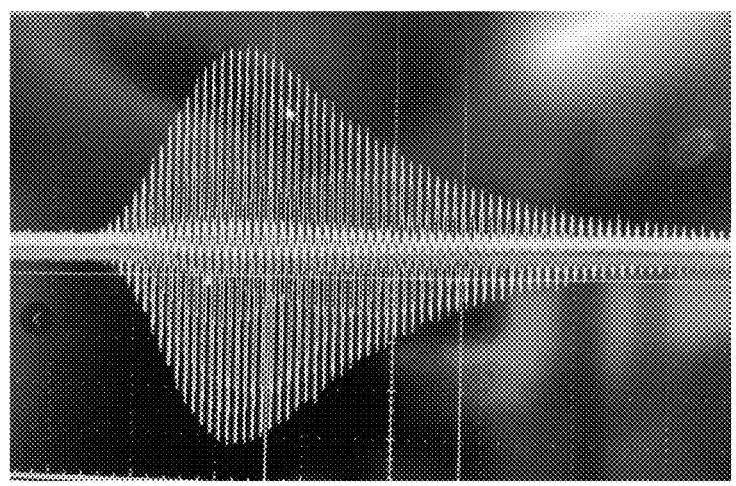
FIG. 9a schematically shows a waveform diagram of an ultrasonic echo signal.
Figure 9B:
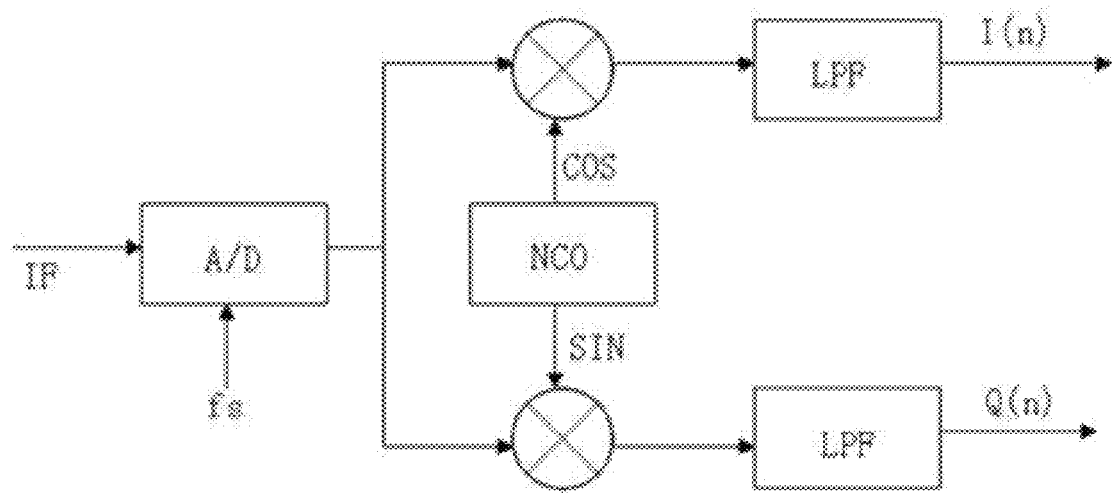
FIG. 9b shows a schematic principle diagram of the modem shown in FIG. 6.

FIG. 9a schematically shows a waveform diagram of an ultrasonic echo signal; FIG. 9b shows a schematic principle diagram of signal demodulation performed by the modem shown in FIG. 6.

As shown in FIG. 9a, the ultrasonic echo signal received by the receiving circuit 620 from the ultrasonic sensor 120 may be in the form of an envelope. Therefore, it is necessary to perform demodulation operations such as IQ quadrature demodulation on the echo signal to facilitate subsequent gesture recognition based on the demodulated echo signal, and realize filtering and save storage space.

As shown in FIG. 6, after amplification, band-pass filtering, and analog-to-digital conversion, the received echo signal needs to be demodulated by the modem 624. The working principle of the modem can be seen in FIG. 9b. Since its specific structure and principle are similar to related technologies, it will not be repeated here.

Figure 10:
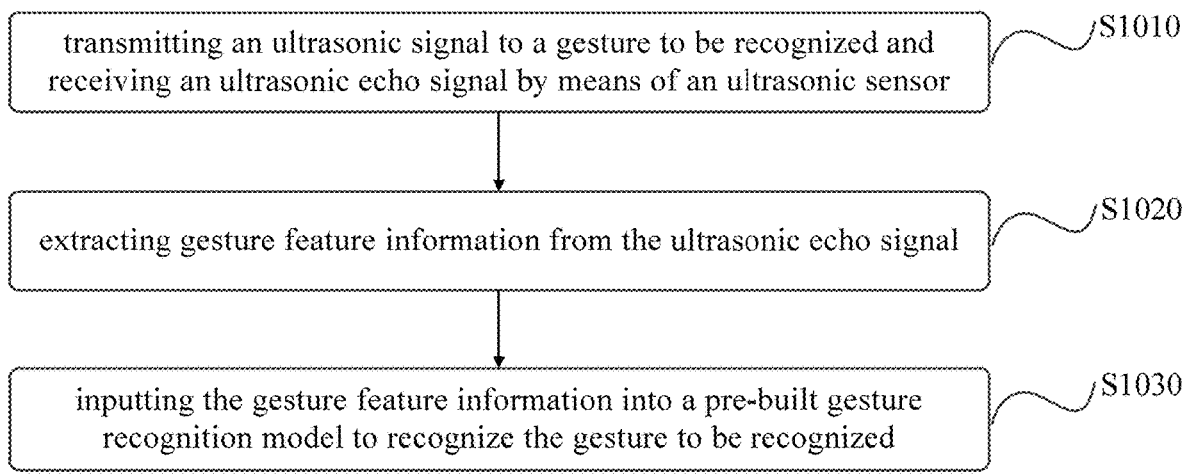
FIG. 10 shows a flowchart of a method for performing gesture recognition using a display device according to some embodiments of the present disclosure.

FIG. 10 shows a flowchart of a gesture recognition method using the display device 100 according to some embodiments of the present disclosure. The gesture recognition method according to some embodiments of the present disclosure may adopt a machine learning based mode to recognize gestures. The gesture recognition method shown in FIG. 10 can be executed by the control component 600 shown in FIG. 6, especially the control circuit 630 therein.

As shown in FIG. 10, the gesture recognition method according to some embodiments of the present disclosure includes steps S1010-S1030.

In S1010, transmitting ultrasonic signals to the gesture to be recognized and receiving ultrasonic echo signals reflected from the gesture to be recognized by means of the ultrasonic sensor.

In some embodiments, the gesture to be recognized may include at least one of the shape and action of the hand. For example, the shape of the hand includes hand gestures such as making a fist, unfolding the palm (such as salute, traffic police gestures, etc.), extending one or more fingers; the action of the hand may include spatial movement behaviors of the hand in directions such as up, down, left, right, front and back. In the present disclosure, the principle of gesture recognition is: first, the ultrasonic sensor integrated in the display device is used to transmit ultrasonic signals to the gesture to be recognized and receive the corresponding reflected one or more echo signals, the user's hand being the signal source of the echo signal; then these echo signals are processed to extract the gesture feature information used to recognize the gesture; finally, the gesture feature information is combined with the machine learning model to determine the gesture to be recognized.

In S1020, extracting the gesture feature information from the ultrasonic echo signal.

In some embodiments, the gesture feature information refers to the information extracted from the echo signal for gesture recognition, and the gesture recognition information may include at least one or more of the direction-of-arrival (DOA) pitch angle, the projection distribution, the echo frequency change and the echo time. The aforementioned gesture feature information can be constructed into a feature vector by quantifying the information to facilitate subsequent gesture recognition through a deep machine learning model. That is, the feature vector can include at least one item or a combination of multiple items of the degree of the direction-of-arrival pitch angles (angle or radian) of the echo signal, the distribution vector (or position coordinates) of the projection points of different echo signals on the XOY plane, the echo frequency difference of the two consecutive frames of signal, and the echo duration of the echo signal.

Figure 11:
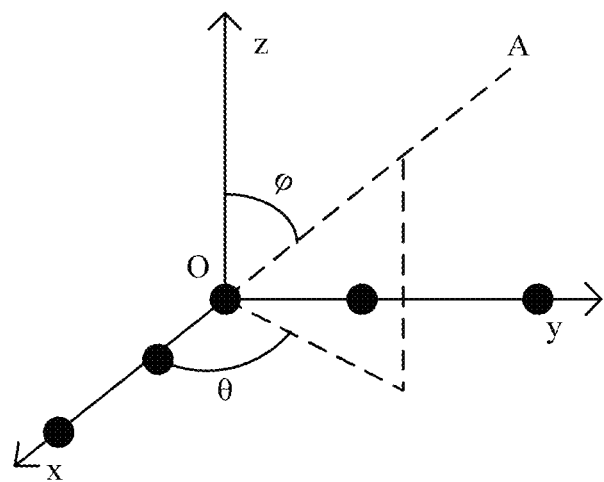
FIG. 11 shows a schematic diagram of a direction-of-arrival pitch angle of an echo signal according to some embodiments of the present disclosure.

FIG. 11 shows a schematic diagram of a direction-of-arrival pitch angle of an echo signal according to some embodiments of the present disclosure. As shown in FIG. 11, in the spatial (rectangular) three-dimensional coordinate system, the signal source A (for example, at least a part of the gesture to be recognized) of the echo signal is the signal transmitting terminal, and the black dots indicate the signal receiving terminal, and the angles φ and θ respectively indicates the angle between the line AO of the signal source A and the origin O and the z-axis, and the angle between the projection of the line AO on the XOY plane and the x-axis. The angles φ and θ are respectively called the DOA elevation angle and DOA depression angle (or azimuth angle) of the signal source. It can be known from the spatial relationship that the position of the signal source can be determined according to the coordinate relationship by obtaining the information of the pitch angle θ and φ of the signal source. For the calculation of the pitch angle of the signal source, it can be realized by the DOA estimation algorithm. Currently, the DOA estimation algorithm mainly includes MUSIC, ESPRIT and other algorithms.

Figure 12:
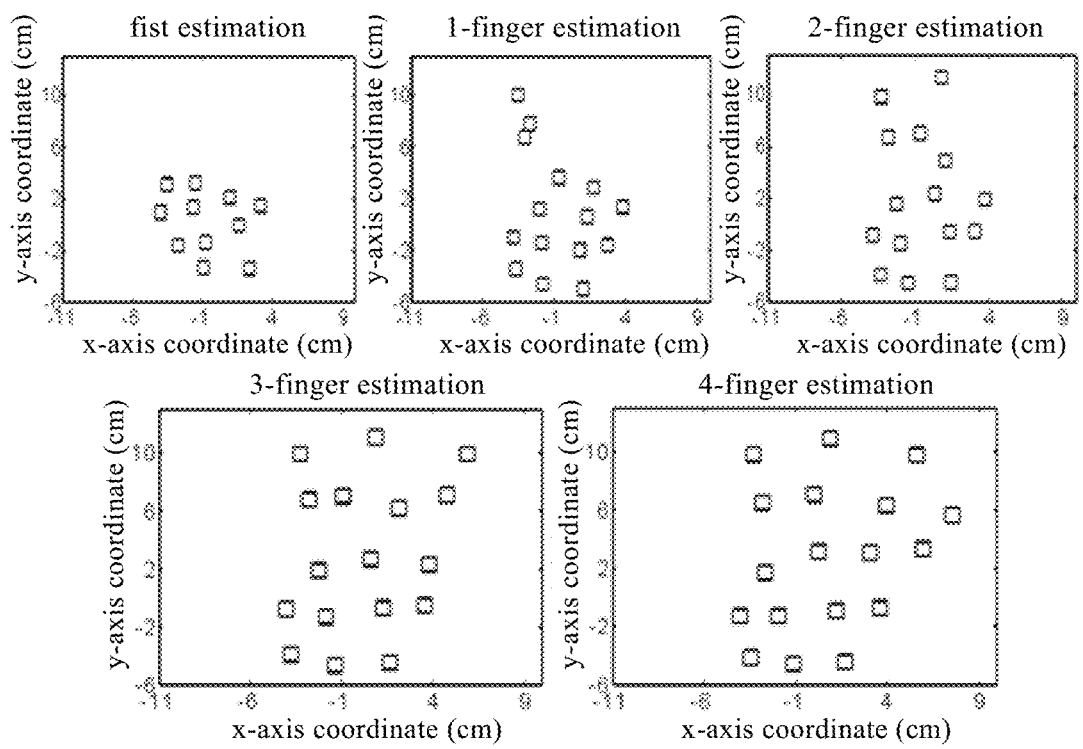
FIG. 12 shows a schematic diagram of projection distribution of echo signals according to some embodiments of the present disclosure.

FIG. 12 shows a schematic diagram of projection distribution of echo signals from different signal sources according to some embodiments of the present disclosure.

The position of the projection point distribution of the ultrasonic echo signal is the key to gesture recognition. When the ultrasonic is transmitted to the user's hand (i.e., gesture to be recognized), the number of signal sources reflected by the echo signal and the reachable positions of the echo signals are different due to the different shape of the palm (for example, different number of fingers opened, fist made or extended). Therefore, the recognition of the shape of the gesture can be realized based on this principle.

Specifically, the projection point distribution of the echo signal can be obtained by the following methods: firstly, the number of signal sources is calculated based on a coherent source estimation algorithm, such as canonical correlation technology, information theory methods based on probability statistics, etc.; then the direction-of-arrival of each signal source is calculated based on the DOA algorithm, to obtain the position information of each signal source; then each signal source is projected on the XOY plane, and the position information of different gesture shapes on the XOY plane can be obtained after the projection.

As shown in FIG. 12, different gesture shapes correspond to different projection point distributions on the plane XOY. As shown in FIG. 12, it shows the distribution of the echo signal projection points of five gestures, which are distribution of the projection points on the XOY plane of the echo signals reflected by a fist, a finger, two fingers, three fingers, and four fingers. The projection point distribution feature can be described by the number of projection points in each coordinate point position in mathematical expression, that is, in a certain scope in the XOY plane, the plane is divided into grid by unit coordinate length in the horizontal and vertical directions, and the number of coordinate points in each grid is counted and combined into a vector form in a certain order to obtain the projection distribution vector. For example, the projection point distribution vector can be expressed as: $(a_1, a_2, a_3, \ldots, a_n)$, where n represents the number of grids in the XOY plane, $a_i$ represents the number of projection points in the i-th grid, $i=1, \ldots, n$. For example, one possible form is: (0, 0, 1, 0, 1 . . . 1, 0, 0).

In order to recognize actions in gestures, the Doppler effect needs to be used. The Doppler effect refers to the phenomenon that the frequency of the sound heard by the observer is different from the frequency of the vibration source when there is relative movement between the vibration source and the observer. For example, if the frequency of the transmitted sound source is $f_0$, the frequency measured by the observer is $f_a=(c+v_s)*f_0/(c+v_a)$, where $v_s$ is the speed of the vibration element and $v_a$ is the speed of the receiving device, c is the sound propagation speed. Specifically, due to the existence of the Doppler effect, when the signal source moves or shifts relative to the reference point, the frequency of the signal obtained by the observer at the reference point is different, that is, the frequency increases when the two are close to each other, and the frequency observed at the reference point decreases when the two are away from each other. Therefore, based on the frequency change of the signal echo of the two consecutive frames, the displacement such as gesture push and pull can be recognized. The calculation of the frequency change $\Delta f$ can be realized by methods such as FFT-based RIFE operation.

Generally, since the time span of horizontal gestures is short and the time span of vertical gestures is longer, the signal echo time (i.e., the duration of the echo signal) $\Delta t$ can also be used to identify the displacement or action of the gesture.

In some embodiments, the feature vector corresponding to the feature information extracted from the echo signal can be expressed as $T=[(\theta, \phi), (a_1, a_2, a_3, \ldots, a_n), \Delta f, \Delta t]$, where $(\theta, \phi)$ is the direction-of-arrival pitch angle, $(a_1, a_2, a_3, \ldots, a_n)$ is the distribution position of the projection point, $\Delta f$ is the frequency change, and $\Delta t$ is the echo time.

In S1030, inputting the gesture feature information into a pre-built gesture recognition model to recognize the gesture to be recognized.

On the basis of obtaining the gesture feature information (or feature vector, such as $[(\theta, \phi), (a_1, a_2, a_3, \ldots, a_n), \Delta f, \Delta t]$), the gesture to be recognized can be intelligently recognized or classified by a (deep) machine learning (neural network) model. The pre-built gesture recognition model in step S1030 can be obtained by training the classifier model in a supervised manner. The input of the gesture recognition model can be gesture feature information (i.e., gesture feature vector) extracted from the echo signal of the gesture to be recognized, the output is the probability that the gesture to be recognized belongs to a predetermined category. In this way, it is possible to determine which category the gesture to be recognized belongs to by comparing the obtained probability value with the preset threshold value.

In the gesture recognition method according to some embodiments of the present disclosure, the display device integrated with the ultrasonic sensor is used to realize the gesture recognition through the analysis of the echo signal and the machine learning model. Since echo signal analysis considers a variety of feature information (such as the direction-of-arrival (DOA) pitch angle, the projection distribution, the echo frequency change, and the echo time of the echo signal), it can recognize various hand shapes, postures, movements or displacements, which enriches the range of gesture recognition; and since a machine learning model (such as a pre-built gesture recognition model) obtained after a large amount of sample data is pre-trained is adopted for gesture recognition, its recognition accuracy and effect has also been significantly improved.

FIG. 13 shows a flowchart of a training method for a gesture recognition model according to some embodiments of the present disclosure. As shown in FIG. 13, the pre-built gesture recognition model is obtained through the following steps S1310-S1330.

In S1310, for each gesture category in a plurality of preset gesture categories, acquiring ultrasonic echo signals of multiple gestures corresponding to the gesture category by means of the ultrasonic sensor, and extracting gesture feature information corresponding to the gesture category from the ultrasonic echo signals.

FIG. 14 shows an example diagram of preset gesture categories of a pre-built gesture recognition model according to some embodiments of the present disclosure. As shown in FIG. 14, in the pre-built gesture recognition model, 20 gesture categories can be preset, and each gesture category corresponds to corresponding shape and displacement information. In the process of model training, one can make corresponding gestures and displacement actions for different categories, such as category 1 to category 20 as shown in FIG. 14, and transmit ultrasonic signals to these gestures by the ultrasonic sensor; then the echo signal reflected by the gesture is analyzed, and the gesture feature information (for example, including at least one or more of the direction-of-arrival pitch angle, the position of the projection point distribution, the echo frequency change and the echo time of the echo signal) corresponding to the echo signal is extracted.

In S1320, determining a training sample and a corresponding sample label based on each gesture category in the multiple preset gesture categories and its corresponding gesture feature information.

The large amount of gesture feature information acquired corresponding to each preset category of gesture can be used as a training sample, and the preset gesture category corresponding to each of these gesture feature information is the corresponding sample label.

In S1330, training a classifier model by means of the training samples and corresponding sample labels to obtain the pre-built gesture recognition model.

After the training samples and corresponding labels are obtained, the classifier model can be trained based on the above training samples and sample labels, that is, the output result obtained by input the training samples is compared with the corresponding labels to continuously adjust the parameters of the model, and finally obtains a gesture recognition model that meets certain requirements. The embodiments of the present application do not limit the specific form of the classifier model used in the training of the gesture recognition model. The classifier model can be a model based on any appropriate classification algorithm or neural network algorithm. Examples of classifier models include but are not limited to Xgboost network, long short-term memory (LSTM) network, gated recurrent unit (GRU), time delay neural network (TDNN), convolutional neural network (CNN), Random Forest Classifier, LightGBM Classifier, SVM, KNN, GMM, etc.

The above description is only a preferred embodiment of the present disclosure and an explanation of the applied technical principle. Those skilled in the art should understand that the scope of disclosure involved in the present disclosure is not limited to the technical solutions formed by the specific combination of the above technical features, and should also cover other technical solutions formed by arbitrarily combining the above technical features or equivalent technical features thereof without departing from the foregoing disclosure concept, for example, technical solutions formed by replacing the above-mentioned features with technical features having similar functions with the features disclosed in the present disclosure.

In the description of this specification, the descriptions of the terms "one embodiment", "some embodiments", "examples", "specific examples", or "some examples" etc. mean the specific features, structures, materials, or characteristics described in conjunction with the embodiment or example is included in at least one embodiment or example of the present disclosure. In this specification, the schematic representations of the above-mentioned terms are not necessarily directed to the same embodiment or example. Moreover, the described specific features, structures, materials or characteristics can be combined in any one or more embodiments or examples in a suitable manner. In addition, those skilled in the art can combine the different embodiments or examples and the features of the different embodiments or examples described in this specification without contradicting each other.

It should be understood that various methods of the present disclosure can be implemented by hardware, software, firmware, or a combination thereof. In the above embodiments, multiple steps or methods can be implemented by software or firmware stored in a memory and executed by a suitable instruction execution system. For example, if it is implemented by hardware, it can be implemented by any one of or a combination of the following technologies known in the art: discrete logic circuits with logic gates for implementing logic functions on data signals, application specific integrated circuits with appropriate combinations logic gate circuits, Programmable Gate Array, Field Programmable Gate Array, etc.

A person of ordinary skill in the art can understand that all or part of the steps of the method in the foregoing embodiments can be completed by a program instructing relevant hardware, and the program can be stored in a computer-readable storage medium. When the program is executed, it can implement one of the steps of the method embodiment or a combination thereof.

In addition, the functional units in the various embodiments of the present disclosure may be integrated into one processing module, or each unit may exist alone physically, or two or more units may be integrated into one module. The above-mentioned integrated modules can be implemented in the form of hardware or software functional modules. If the integrated module is implemented in the form of a software function module and sold or used as an independent product, it can also be stored in a computer readable storage medium.

The invention claimed is:

1. A display device comprising:
a display module comprising a base and an array substrate, a resin layer, a first electrode layer, a pixel definition layer, a light-emitting unit layer, a second electrode layer disposed opposite to the first electrode layer, and an encapsulation layer sequentially disposed on the base, wherein the light-emitting unit layer is between the first electrode layer and the second electrode layer and comprises a plurality of light-emitting units respectively disposed in a plurality of openings of the pixel definition layer; and
an ultrasonic sensor comprising the second electrode layer, a piezoelectric material layer disposed between the first electrode layer and the pixel definition layer, and a third electrode layer disposed between the pixel definition layer and the resin layer, wherein the piezoelectric material layer comprises a plurality of piezoelectric material units separated by the plurality of light-emitting units, and the third electrode layer comprises a plurality of third electrodes respectively disposed corresponding to the plurality of piezoelectric material units.

2. The display device according to claim 1, wherein the ultrasonic sensor further comprises:
a plurality of vibration cavities respectively disposed on a side of each of the plurality of third electrodes away from the pixel definition layer.

3. The display device according to claim 1, wherein each of the plurality of piezoelectric material units is a piezoelectric film.

4. The display device according to claim 1, wherein an orthographic projection of each of the plurality of piezoelectric material units on the substrate, an orthographic projection of the third electrode corresponding to the piezoelectric material unit on the substrate, and an orthographic projection of the vibration cavity corresponding to the third electrode on the substrate at least partially overlap.

5. The display device according to claim 2, wherein each of the plurality of vibration cavities is disposed in at least one of the resin layer, the array substrate, and the base.

6. The display device according to claim 1, wherein a width of each of the plurality of third electrodes is equal to or greater than a width of the corresponding piezoelectric material unit.

7. The display device according to claim 1, further comprising a control component for controlling the ultrasonic sensor, the control component comprising:
an excitation circuit configured to excite the ultrasonic sensor to transmit ultrasonic waves;
a receiving circuit configured to receive an echo signal of the ultrasonic waves reflected by a gesture to be recognized and process the echo signal; and
a control circuit configured to control the excitation circuit and perform gesture recognition based on the processed echo signal.

8. The display device according to claim 7, wherein the excitation circuit comprises:
an excitation signal generating circuit configured to generate an excitation signal to excite the ultrasonic sensor to transmit ultrasonic waves.

9. The display device according to claim 8, wherein the excitation circuit further comprises:
an impedance matching circuit electrically connected between the excitation circuit and the ultrasonic sensor.

10. The display device according to claim 7, wherein the receiving circuit comprises:
a preamplifier configured to amplify the echo signal of the ultrasonic waves acquired by the ultrasonic sensor;
a band-pass filter configured to band-pass filter the amplified echo signal; and
an analog-to-digital converter configured to perform analog-to-digital conversion on the filtered echo signal.

11. The display device according to claim 10, wherein the preamplifier comprises:
a differential signal acquisition circuit configured to perform differential signal acquisition on the echo signal of the ultrasonic waves acquired by the ultrasonic sensor, and
a differential amplifier circuit configured to amplify the echo signal based on the acquired differential signal.

12. The display device according to claim 10, wherein the receiving circuit further comprises:
a modem configured to demodulate the echo signal after the analog-to-digital conversion.

13. A method for producing the display device according to claim 1, comprising:
manufacturing an array substrate layer on a base;
depositing a resin layer on the array substrate layer;
manufacturing a first electrode layer and a third electrode layer interlaced with each other on the resin layer;
punching holes on the resin layer to deposit ITO to connect the first electrode layer and the third electrode layer respectively;
etching at positions corresponding to the third electrode layer in the resin layer, the array substrate layer and the base to form vibration cavities;
depositing a pixel definition layer on the first electrode layer and the third electrode layer;
vapor depositing at positions corresponding to the first electrode layer in the pixel definition layer to manufacture a light-emitting layer, and depositing a piezoelectric material layer at positions corresponding to the third electrode layer on the pixel definition layer;
manufacturing a second electrode layer on the piezoelectric material layer and the light-emitting layer; and
manufacturing an encapsulation layer on the second electrode layer.

14. A gesture recognition method using the display device according to claim 1, comprising:
- transmitting an ultrasonic signal to a gesture to be recognized and receiving an ultrasonic echo signal reflected from the gesture to be recognized by means of an ultrasonic sensor;
- extracting gesture feature information from the ultrasonic echo signal; and
- inputting the gesture feature information into a pre-built gesture recognition model to recognize the gesture to be recognized.

15. The method according to claim 14, wherein the gesture to be recognized comprises at least one of a shape and an action of a hand to be recognized.

16. The method according to claim 14, wherein the gesture feature information comprises at least one of a direction-of-arrival pitch angle, a projection distribution, an echo frequency change, and an echo time of the ultrasonic echo signal.

17. The method according to claim 14, wherein the pre-built gesture recognition model is obtained by the following steps:
- for each gesture category of a plurality of preset gesture categories, acquiring ultrasonic echo signals of multiple gestures corresponding to the gesture category, and extracting gesture feature information corresponding to the gesture category from the ultrasonic echo signals;
- determining training samples and corresponding sample labels based on each gesture category of the plurality preset gesture categories and its corresponding gesture feature information; and
- training a classifier model by means of the training samples and the corresponding sample labels to obtain the pre-built gesture recognition model.

* * * * *